United States Patent
Heller

(10) Patent No.: US 10,053,360 B1
(45) Date of Patent: Aug. 21, 2018

(54) PSEUDO SOI PROCESS

(71) Applicant: Kionix, Inc., Ithaca, NY (US)

(72) Inventor: Martin Heller, Ithaca, NY (US)

(73) Assignee: Kionix, Inc., Ithaca, NY (US)

( * ) Notice: Subject to any disclaimer, the term of this patent is extended or adjusted under 35 U.S.C. 154(b) by 0 days.

(21) Appl. No.: 15/685,879

(22) Filed: Aug. 24, 2017

Related U.S. Application Data

(60) Provisional application No. 62/544,708, filed on Aug. 11, 2017.

(51) Int. Cl.
*H01L 21/00* (2006.01)
*B81C 1/00* (2006.01)

(52) U.S. Cl.
CPC ...... *B81C 1/00047* (2013.01); *B81C 1/00095* (2013.01); *B81C 2201/0115* (2013.01); *B81C 2201/0132* (2013.01); *B81C 2201/0171* (2013.01); *B81C 2201/0178* (2013.01)

(58) Field of Classification Search
CPC .................. B81C 1/00047; B81C 1/00095
See application file for complete search history.

(56) References Cited

U.S. PATENT DOCUMENTS

| | | | |
|---|---|---|---|
| 5,693,574 A | 12/1997 | Schuster et al. | |
| 5,905,203 A | 5/1999 | Flach et al. | |
| 6,245,636 B1 * | 6/2001 | Maszara | H01L 21/76232 257/E21.549 |
| 6,403,485 B1 * | 6/2002 | Quek | H01L 21/76895 257/E21.59 |
| 7,442,570 B2 | 10/2008 | Nasiri et al. | |
| 8,237,296 B2 | 8/2012 | Hancer | |
| 8,905,293 B2 | 12/2014 | Liu et al. | |
| 2009/0191660 A1 | 7/2009 | Christenson et al. | |
| 2012/0205653 A1 | 8/2012 | Nishikage et al. | |
| 2012/0313235 A1 | 12/2012 | Chu et al. | |
| 2013/0068013 A1 | 3/2013 | Beck et al. | |
| 2015/0344299 A1 | 12/2015 | Chang et al. | |

(Continued)

FOREIGN PATENT DOCUMENTS

| | | |
|---|---|---|
| DE | 102005042754 B4 | 9/2008 |
| EP | 1264330 B1 | 7/2003 |

OTHER PUBLICATIONS

Eichler et al., "Plasma Activation as a Pretreatment Tool for Low-Temperature Direct Wafer Bonding in Microsystem Technology," ECS Transactions, 50(7):265-276, (2012).

(Continued)

*Primary Examiner* — Richard Booth
(74) *Attorney, Agent, or Firm* — Alston & Bird LLP

(57) ABSTRACT

A method of processing a semiconductor substrate having a first conductivity type includes, in part, forming a first implant region of a second conductivity type in the semiconductor substrate where the first implant region is characterized by a first depth, forming a second implant region of the first conductivity type in the semiconductor substrate where the second implant region is characterized by a second depth smaller than the first depth, forming a porous layer within the semiconductor substrate where the porous layer is adjacent the first implant region, and growing an epitaxial layer on the semiconductor substrate thereby causing the porous layer to collapse and form a cavity.

14 Claims, 6 Drawing Sheets

(56) References Cited

U.S. PATENT DOCUMENTS

2016/0061679 A1 3/2016 Adams et al.

OTHER PUBLICATIONS

Evertsson et al., "The thickness of native oxides on aluminum alloys and single crystals," Applied Surface Science, 349: 826-832, (2015).

Gabriel et al. "Lokale Plasma-Behandlung in einem Mask Aligner zur selektiven Veränderung der Oberfläche von Wafern Local plasma treatment in a Mask Aligner for selective wafer surface modification," Mikrosystemtechnik Kongress, pp. P8.24-P8.24, (2009). Abstract in English.

Gabriel et al., "Wafer direct bonding with ambient pressure plasma activation," Microsyst Technol, 12:397-400, (2006).

Heller et al., "Surface Preparation and Eutectic Wafer Bonding," ECS Transactions, 75(9):229-239, (2016).

Jeurgens et al., "Determination of thickness and composition of aluminum-oxide overlayers on aluminum substrates," Applied Surface Science, 144-145:11-15, (1999).

Klages et al., "Surface Technology with Cold Microplasmas," Plasma Processes and Polymers, 4, 208-218, (2007).

Mcalister et al., "The Al—Ge (Aluminum-Germanium) system," Bulletin of Alloy Phase Diagrams, 5:341-347, (1984). Errata 6(2):111-113 and 183-184, (1985).

Okamoto, "Al—Ge (Aluminum-Germanium)," Journal of Phase Equilibria, 19(1):86, (1998).

Onsia et al., "A Study of the Influence of Typical Wet Chemical Treatments on the Germanium Wafer Surface," Solid State Phenomena, 103-104:27-30, (2005).

Sood, "Advanced Metal-Eutectic Bonding for High Volume MEMS WLP," IEEE MEMS Bay Area Meeting, 30 pages, (2014).

Sood, et al., "Al—Ge Eutectic Wafer Bonding and Bond Characterization for CMOS Compatible Wafer Packaging," ECS Transactions, 33(4):93-101, (2010).

Zavracky et al., "Patterned Eutectic Bonding with Al/Ge Thin Films for MEMS," SPIE, 2639:46-52, (1995).

WIPO Application No. PCT/US2018/026107, PCT International Search Report and Written Opinion of the International Searching Authority dated Jun. 21, 2018.

\* cited by examiner

PSEUDO SOI PROCESS

CROSS REFERENCE TO RELATED APPLICATON

The present application claims benefit under 35 USC 119 (c) of U.S. Provisional Application No. 62/544,708, filed Aug. 11, 2017, the content of which is incorporated herein by reference in its entirety.

FIELD OF THE INVENTION

The present invention relates to semiconductor manufacturing process, and more particularly to a process for manufacturing a MEMS device.

BACKGROUND

Micro Electro-Mechanical Systems (MEMS), such as motion sensors and movable mirrors, are being widely used. As is well known, a MEMS motion sensor may be, for example, an accelerometer for detecting linear motion, or a gyroscope for detecting rotation and angular velocity. A need continues to exist for improvement in manufacturing MEMS devices.

BRIEF SUMMARY OF THE INVENTION

A method of processing a semiconductor substrate having a first conductivity type, in accordance with one embodiment of the present invention includes, in part, forming a first implant region of a second conductivity type in the semiconductor substrate wherein the first implant region is characterized by a first depth, forming a second implant region of the first conductivity type in the semiconductor substrate wherein the second implant region is characterized by a second depth smaller than the first depth, forming a porous layer within the semiconductor substrate wherein the porous layer is adjacent the first implant region, and growing an epitaxial layer on the semiconductor substrate thereby causing the porous layer to collapse and form a cavity.

In one embodiment, the method further includes, in part, forming a third implant region of the second conductivity type in the semiconductor substrate. The third implant region is characterized by a second depth greater than the first depth. In one embodiment, the method further includes, in part, forming a multitude of trenches in the epitaxial layer positioned above the cavity, and filling the multitude of trenches with an insulating material.

In one embodiment, the method further includes, in part, forming at least one through-silicon via (TSV) in the semiconductor substrate prior to growing the epitaxial layer. In one embodiment, the method further includes, in part, forming a layer of insulating material along the sidewalls of the TSV prior to growing the epitaxial layer. In one embodiment, the method further includes, in part, forming a layer of metal over the insulating material disposed on the sidewalls of the TSV prior to growing the epitaxial layer.

In one embodiment, the method further includes, in part, forming a multitude of isolation joints in the epitaxial layer with each isolation joint making contact with the insulating material disposed on the sidewalls of the TSV. In one embodiment, the method further includes, in part, forming a trench in the epitaxial layer and around outside periphery of the isolation joints. In one embodiment, the method further includes, in part, forming a layer of insulating material on the semiconductor substrate and around an opening of the TSV, the first layer of insulating material being formed prior to growing the epitaxial layer.

In one embodiment, the method further includes, in part, forming a layer of insulating material along the sidewalls of the TSV prior growing the epitaxial layer. In one embodiment, the method further includes, in part, forming a layer of metal over the insulating material disposed on the sidewalls of the TSV prior to growing the epitaxial layer.

In one embodiment, the method further includes, in part, forming a multitude of isolation joints in the epitaxial layer, each isolation joint making contact with the insulating material disposed on the sidewalls of the TSV. In one embodiment, the method further includes, in part, forming a trench in the epitaxial layer and around outside periphery of the plurality of isolation joints. In one embodiment, the first conductivity type is p-type and the second conductivity type is n-type.

DETAILED DESCRIPTION OF THE INVENTION

In accordance with one embodiment of the present invention, a MEMS device is made in a cavity formed in response to growing an epitaxial layer on a semiconductor substrate having a porous region.

Figure 1:
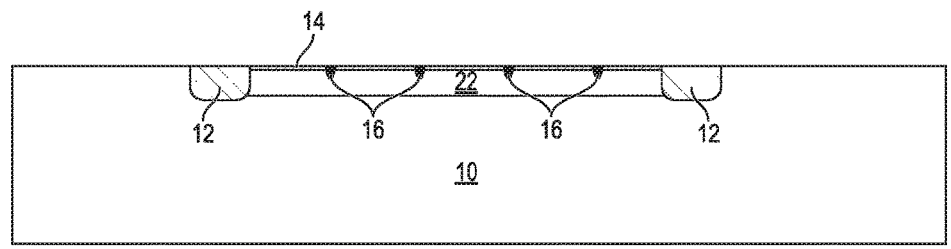
FIG. 1 is a cross-sectional view of a semiconductor substrate in which a MEMS device is formed, in accordance with one exemplary embodiment of the present invention.

FIG. 1 is a cross-sectional view of a semiconductor substrate 10 in which a MEMS device is formed, in accordance with one exemplary embodiment of the present invention. In the following it is assumed that semiconductor substrate 10 is a p-type substrate. It is understood, however, that embodiments of the present invention are not so limited and that substrate 10 may be an n-type substrate. Using conventional semiconductor processing steps, deep n+ implant regions 12, a multitude of relatively shallow n+ implant regions 16, as well a shallow p-type implant region 14 covering the surface of semiconductor substrate 10 between n+ implant regions 12 are formed in semiconductor substrate 10, as shown. P-type implant region 14 has a depth that is smaller than the depth of n+ implant regions 16. In one embodiment n+ implant regions 12 are formed by implanting Antimony that may have different ion energies (e.g., 400 keV, 200 keV, 100 keV, or 50 keV) and ion doses (e.g., $10^{17}$ cm$^{-2}$, $10^{16}$ cm$^{-2}$, $10^{15}$ cm$^{-2}$). For example, the surface concentration may be $1\times10^{20}$ cm$^{-3}$; peak concentration may be $1\times10^{21}$ cm-3 with a depth of 1500 nm, and a range of 2500 nm. In one embodiment, n+implant regions 16 are formed by implanting Antimony at an energy of, e.g., 100 keV, and dose of $10^{15}$ cm$^{-2}$; for example, peak concentration may be $2\times10^{20}$ cm$^{-3}$ with a depth of 80 nm, and a range of 400 nm. In one embodiment, p-type regions 14 may be formed by implanting Boron at different ion energies (e.g., 100 keV, 80 keV) and ion dose of, e.g., $10^{14}$ cm$^{-2}$; for example, peak concentration may be $2\times10^{18}$ cm$^{-3}$ with a depth of 500 nm and a range of 1000 nm.

Figure 2:
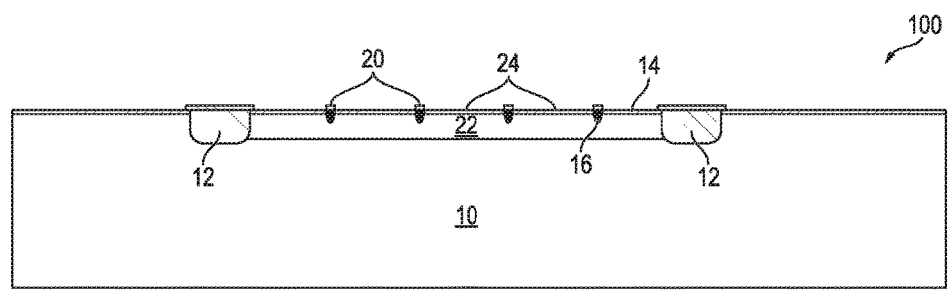
FIG. 2 is a cross-sectional view of the semiconductor substrate of FIG. 1 after undergoing a number of processing steps, in accordance with one exemplary embodiment of the present invention.

Thereafter, as shown in FIG. 2, a masking layer 20, such as silicon nitride, is deposited and patterned to cover implant regions 12, 16 and other exposed surfaces of semiconductor substrate 10 other than shallow implant region 14. Next, using any number of well-known techniques, a layer of nanoporous silicon 22 is formed below the surface of implant region 14. During the formation of the nanoporous silicon layer, a layer of mesoporous silicon layer 24 is formed above implant region 14 of semiconductor structure 100, as is also shown in FIG. 2. Implant regions 12 are substantially unmodified during the porous silicon formation. Furthermore, implant regions 12 prevent the porous silicon from extending laterally beyond the boundaries of implant regions 12.

Figure 3:
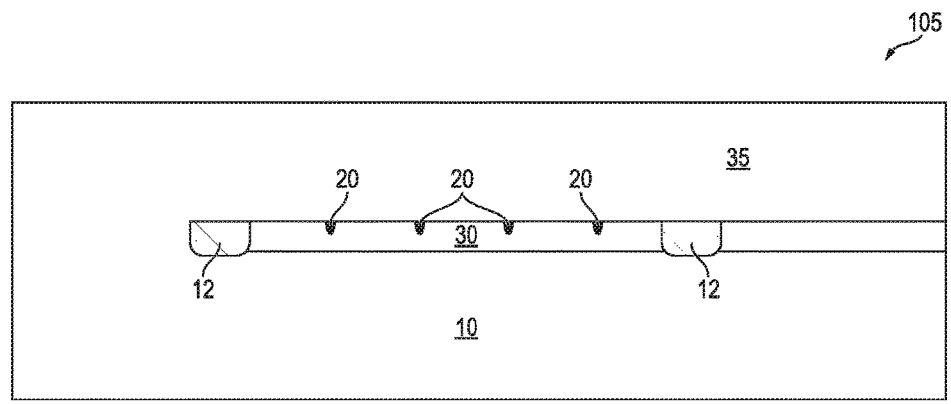
FIG. 3 is a cross-sectional view of the semiconductor substrate of FIG. 2 after growing an epitaxial layer thereon, in accordance with one exemplary embodiment of the present invention.

After removing masking layer 12, an epitaxial layer 35 is grown on substrate 10. As is known, during the high temperature epitaxial growth process, nanoporous layer 22 collapses thereby resulting in the formation of a cavity. FIG. 3 shows semiconductor structure 105 having a cavity 30 disposed between substrate 10, implant regions 12 and epitaxial layer 35. As is seen from FIG. 3, following the epitaxial growth, implant regions 20 protrude into cavity 30. Such protrusions are parts of the MEMS device to limit the movement of the MEMS device. Because the thickness of cavity 30 is substantially similar to the thickness of nanoporous layer 22, cavity 30's thickness is well controlled.

Figure 4:
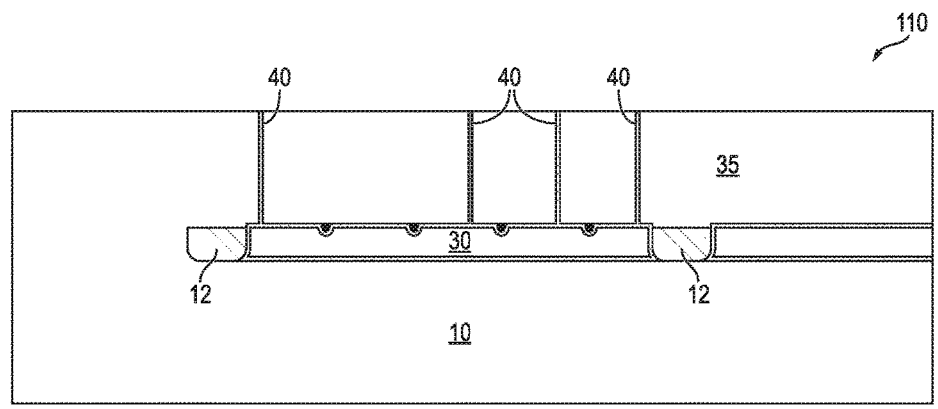
FIG. 4 is a cross-sectional view of the semiconductor substrate of FIG. 3 after formation of isolation joints therein, in accordance with one exemplary embodiment of the present invention.

Next, using a deep reactive ion etching (DRIE) process, trenches are formed in epitaxial layer 35 above cavity 30. The trenches are then filled with oxide to form isolation joints 40, as shown in semiconductor structure 110 of FIG. 4.

Figure 5:
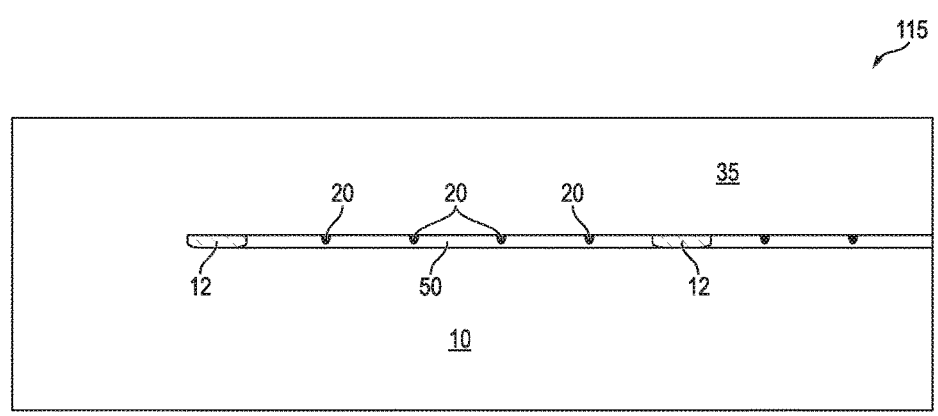
FIG. 5 is a cross-sectional view of the semiconductor substrate of FIG. 2 after growing an epitaxial layer thereon, in accordance with another exemplary embodiment of the present invention.
Figure 6:
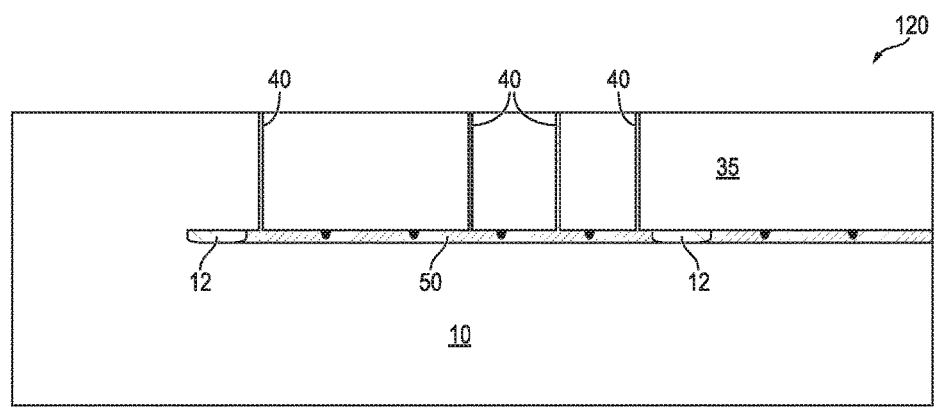
FIG. 6 is a cross-sectional view of the semiconductor substrate of FIG. 5 after formation of isolation joints therein, in accordance with one exemplary embodiment of the present invention.

In accordance with some embodiments, nanoporous layer 22 is selectively formed to have a relatively thin depth thereby giving rise to the formation of a cavity that is also relatively thinner. In such embodiments, during the oxidation of trenches 40, the cavity becomes fully oxidized. FIG. 5 is a cross-sectional view of a semiconductor structure 115 having a relatively thin cavity 50 and an epitaxial layer 35 formed as described above. Cavity 50 shown in FIG. 5 is thinner than cavity 30 shown in FIG. 3. FIG. 6 shows the semiconductor structure of FIG. 5 after trenches have been formed therein and subsequently oxidized. As seen from semiconductor structure 120 of FIG. 6, because cavity 50 is selected to be relatively narrow, during the oxidation of the trenches, the entire cavity is filled with oxide.

Figure 7A:
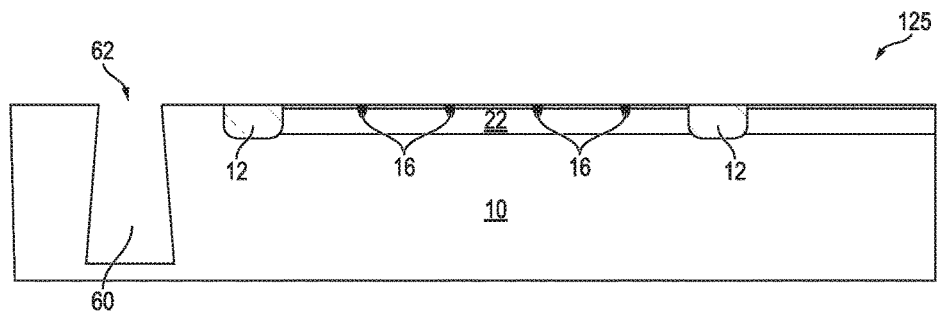
FIG. 7A is a cross-sectional view of the semiconductor structure of FIG. 2 after forming a TSV therein, in accordance with one exemplary embodiment of the present invention.

In some embodiments, to further facilitate electrical connection or provide isolation, between various components of the MEMs device, a through-silicon via (TSV) is formed near the cavity, as described further below. FIG. 7A is a cross-sectional view of the semiconductor structure of FIG. 2 after a reentrant TSV 60 is formed therein. It is understood that to form TSV 60 using conventional deposition and patterning steps, a masking layer, such as silicon nitride, is deposited on structure 100, and subsequently patterned and etched (not shown) to expose the surface of structure 100 at opening 62 where the TSV is subsequently etched via, for example, DRIE etching. After forming the TSV, the masking layer is removed to from semiconductor structure 125 shown in FIG. 7A. The intermediate steps of depositing and patterning of the masking layer is not shown herein. As is seen from FIG. 7A, TSV 60 has a wider opening at its bottom end than at its top end.

Figure 7B:
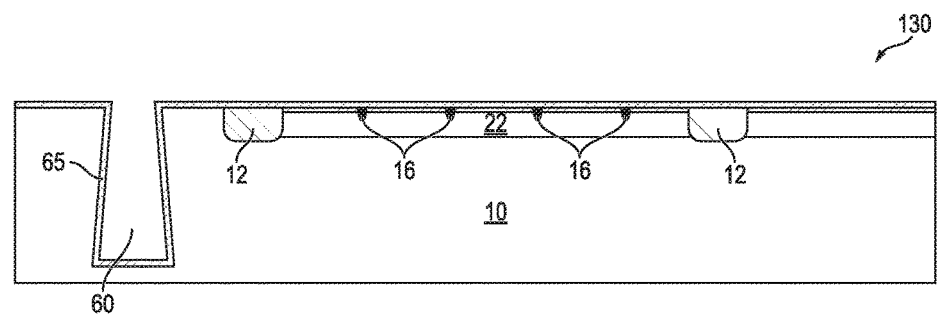
FIG. 7B is a cross-sectional view of the semiconductor substrate of FIG. 7A after depositing a layer of oxide thereon, in accordance with one exemplary embodiment of the present invention.
Figure 8:
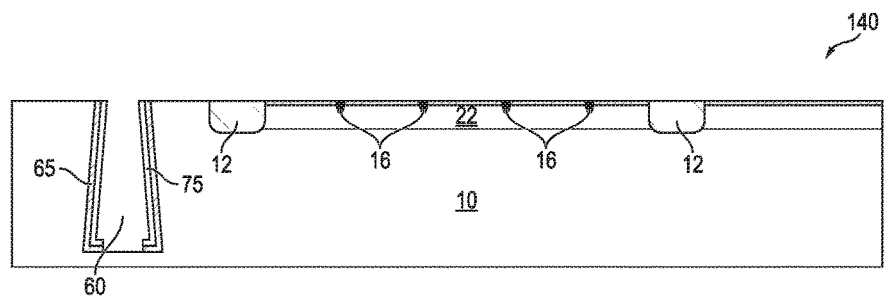
FIG. 8 is a cross-sectional view of the semiconductor substrate of FIG. 7C after a metallization deposition and etching step, in accordance with one exemplary embodiment of the present invention.
Figure 9:
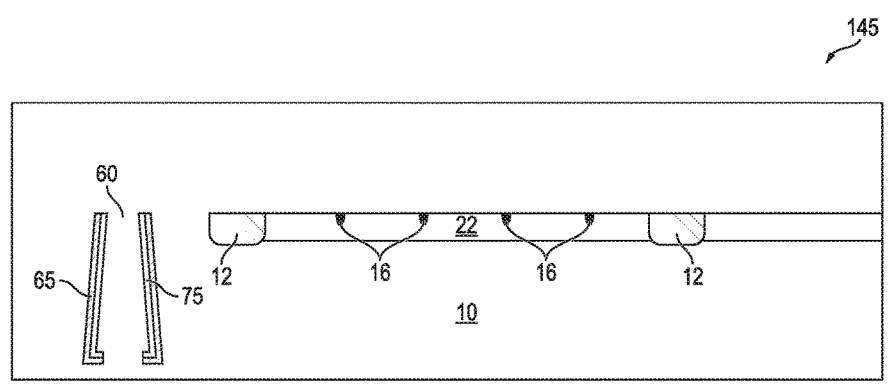
FIG. 9 is a cross-sectional view of the semiconductor structure of FIG. 8 after growing an epitaxial layer thereon, in accordance with one exemplary embodiment of the present invention.

Next, a layer of oxide 65 is deposited on the surface of semiconductor structure 125, using a low-temperature oxidation process, to form the semiconductor structure 130 shown in FIG. 7B. The deposited oxide is then etched back thereby leaving oxide layer 65 along the sidewalls and parts of the bottom of TSV 60, as shown in semiconductor structure 135 of FIG. 7C. In some embodiments, a layer of metal 75, suitable for formation of silicide, is deposited on the oxide layer 65, as shown in semiconductor structure 140 of FIG. 8. In such embodiments, following the etch-back and a high-temperature process, a silicide layer is formed in the TSV. FIG. 9 shows semiconductor structure 140 of FIG. 8 after an epitaxial layer is grown thereon, as described above. As is seen from semiconductor structure 145 of FIG. 9, TSV 60 is also filled with silicon during the epitaxial growth process. In one embodiment, the epitaxial growth is done at a relatively high temperature, such as above 1270 Kelvin, to achieve high deposition rate and TSV fill factor.

Figure 10:
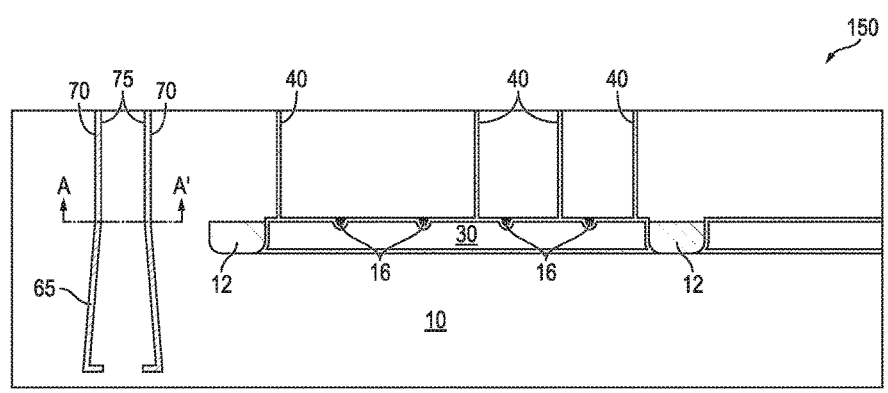
FIG. 10 is a cross-sectional view of the semiconductor substrate of FIG. 9 after formation of isolation joints therein, in accordance with one exemplary embodiment of the present invention.

In order to avoid an oxide ring in the substrate, in some embodiments, using a DRIE process, trenches are formed in the epitaxial layer and filled with oxide 75 to from isolation joints 70 which contacts sidewalls 65 of TSV 60, as shown in semiconductor structure 150 of FIG. 10. Although not shown in FIG. 10, it is understood that the sidewalls may have a silicide layer formed in response to the deposition of a metal layer on oxide layer 65 of the sidewalls, as described above in reference to FIG. 8.

Figure 11A:
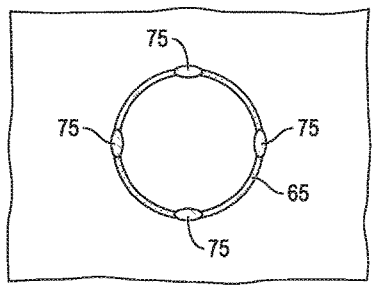
FIG. 11A is a top view of the semiconductor substrate of FIG. 10 when viewed along lines AA', in accordance with one exemplary embodiment of the present invention.
Figure 11B:
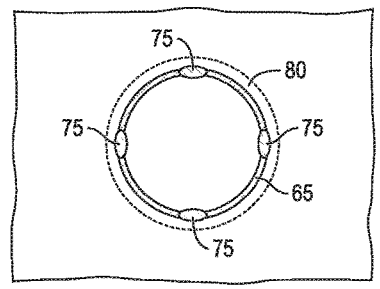
FIG. 11B is a top view of the semiconductor substrate of FIG. 10 along lines AA' when the semiconductor substrate is further processed to include a trench around the periphery of the TSV, in accordance with one exemplary embodiment of the present invention.

FIG. 11A is a top view of semiconductor structure 150 when viewed along lines AA' showing sidewall oxide layer 65 as well as oxide layer 75 of the isolation joints. To more fully isolate TSV 60 electrically, using a DRIE etch process, a trench 80 may be formed around the outside periphery of the TSV, as shown in FIG. 11B.

Figure 7C:
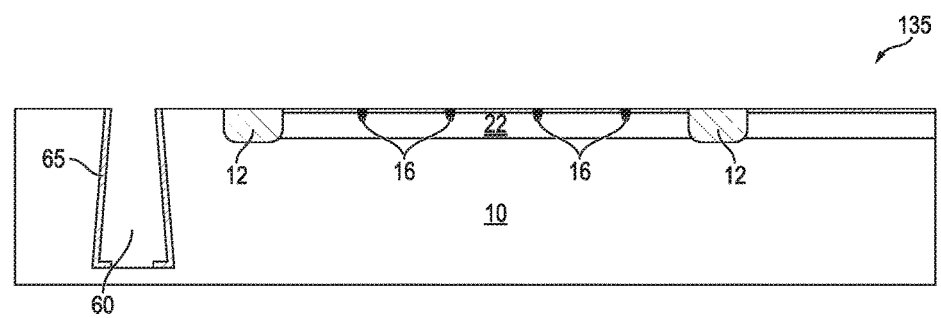
FIG. 7C is a cross-sectional view of the semiconductor substrate of FIG. 7B after an oxide etch-back process, in accordance with one exemplary embodiment of the present invention.
Figure 12A:
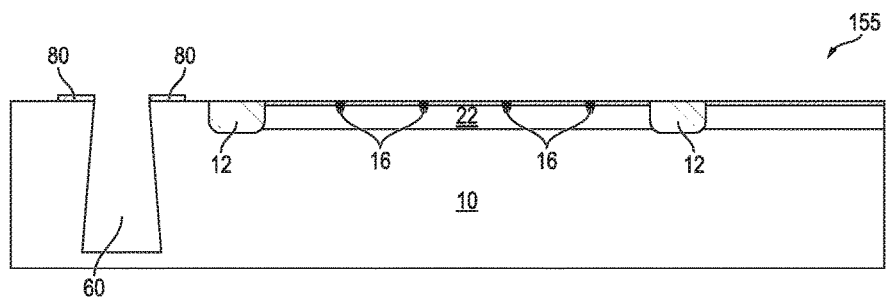
FIG. 12A is a cross-sectional view of the semiconductor structure of FIG. 2 after forming a TSV therein, in accordance with another exemplary embodiment of the present invention.
Figure 12B:
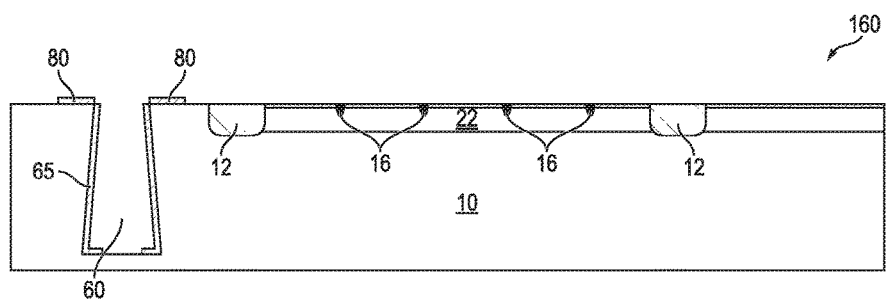
FIG. 12B is a cross-sectional view of the semiconductor substrate of FIG. 12A after oxide is formed on the sidewalls of the TSV, in accordance with one exemplary embodiment of the present invention.
Figure 13:
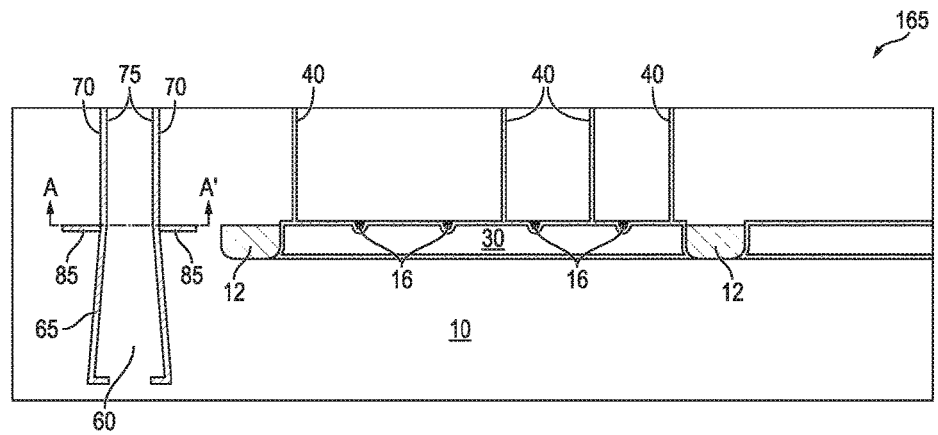
FIG. 13 is a cross-sectional view of the semiconductor substrate of FIG. 12B after growing an epitaxial layer and forming isolation joints therein, in accordance with one exemplary embodiment of the present invention.

In some embodiments, a layer of oxide is formed around the periphery of the TSV before forming an oxide on the sidewalls of the TSV. Semiconductor structure 155 shown in FIG. 12A is similar to semiconductor structure 125 shown in FIG. 7A, except that semiconductor structure 155 has a layer of oxide 85 formed around the outside periphery of its TSV 60's opening. In such embodiments, a layer of oxide 65 is subsequently deposited on the surface of semiconductor structure 155 using a low-temperature oxidation process. The deposited oxide is then etched back thus leaving oxide layer 65 along the sidewalls and parts of the bottom of the TSV, as shown in semiconductor structure 160 of FIG. 12B. Although not shown, in some embodiments, a layer of metal similar to that shown in FIG. 7C is deposited on the oxide layer 65. In such embodiments, after the etch-back and a high-temperature process, a silicide layer is formed on the sidewalls of the trench. Oxide layer 80 is thick enough to withstand the etch-back of the sidewall oxide 65 of the TSV. FIG. 13 shows semiconductor structure 160 of FIG. 12B following the growth of an epitaxial layer and formation of isolation joints 40/70 therein, in the same manner as described above with reference to FIG. 10.

Figure 14A:
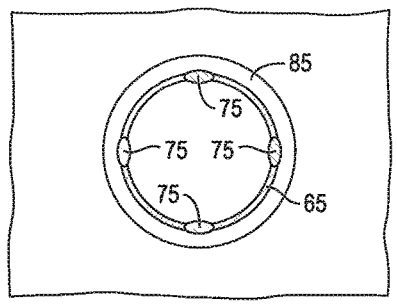
FIG. 14A is a top view of the semiconductor substrate of FIG. 13 when viewed along lines AA', in accordance with one exemplary embodiment of the present invention.
Figure 14B:
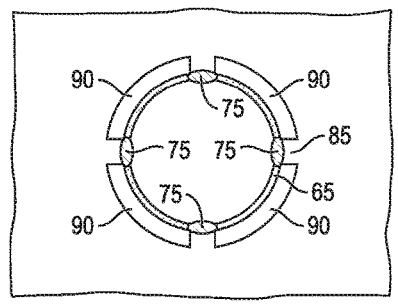
FIG. 14B is a top view of the semiconductor substrate of FIG. 13 along lines AA' when the semiconductor substrate is further processed to include a trench around the periphery of the TSV, in accordance with one exemplary embodiment of the present invention
Figure 15:
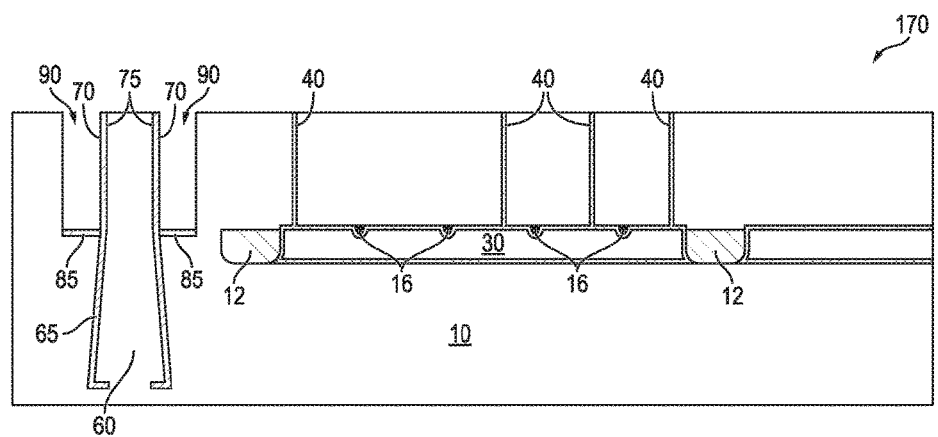
FIG. 15 is a cross-sectional view of the semiconductor substrate of FIG. 14B, in accordance with another exemplary embodiment of the present invention.

FIG. 14A is a top view of semiconductor structure 165 of FIG. 13 when viewed along lines AA' showing sidewall oxide 65, oxide layer 75 of isolation joints 70 and oxide layer 85 formed around the periphery of TSV 60. To more fully isolate TSV 60 electrically, using a DRIE etch process, a trench 90 may be formed around the outside periphery of the TSV, as shown in FIG. 14B. In one embodiment, trench 90 is shown as being positioned above oxide structure 85. FIG. 15 shows semiconductor structure 165 of FIG. 13 after formation of trench 90 above oxide structure 85.

The above embodiments of the present invention are illustrative and not limitative. Embodiments of the present invention are not limited by the type of MEMS device. Embodiments of the present invention are not limited by the type of deposition, patterning, etching, and other semiconductor processing steps required to form the various layers and structures described herein. Embodiments of the present invention are not limited to any specific thicknesses of the layers described herein. Embodiments of the present invention are not limited to the materials/layers described above. Accordingly, it is understood that other semiconductor materials may be present between the various layers described above. Other additions, subtractions or modifications are obvious in view of the present disclosure and are intended to fall within the scope of the appended claims.

What is claimed is:

1. A method of processing a semiconductor substrate having a first conductivity type, the method comprising:
   forming a first implant region of a second conductivity type in the semiconductor substrate, said first implant region characterized by a first depth;
   forming a second implant region of the first conductivity type in the semiconductor substrate, said second implant region characterized by a second depth smaller than the first depth;
   forming a porous layer within the semiconductor substrate, said porous layer being adjacent the first implant region; and
   growing an epitaxial layer on the semiconductor substrate thereby causing the porous layer to collapse and form a cavity.

2. The method of claim 1 further comprising:
   forming a third implant region of the second conductivity type in the semiconductor substrate, said third implant region characterized by a second depth greater than the first depth.

3. The method of claim 2 further comprising:
   forming a plurality of trenches in the epitaxial layer positioned above the cavity; and
   filling the plurality of trenches with an insulating material.

4. The method of claim 3 further comprising:
   forming at least one through-silicon via (TSV) in the semiconductor substrate prior to the growing of the epitaxial layer.

5. The method of claim 2 further comprising:
   forming a layer of insulating material along the sidewalls of the TSV prior to the growing of the epitaxial layer.

6. The method of claim 5 further comprising:
   forming a layer of metal over the insulating material disposed on the sidewalls of the TSV prior to the growing of the epitaxial layer.

7. The method of claim 6 further comprising:
   forming a plurality of isolation joints in the epitaxial layer, each isolation joint making contact with the insulating material disposed on the sidewalls of the TSV.

8. The method of claim 7 further comprising:
   forming a trench in the epitaxial layer and around outside periphery of the plurality of isolation joints.

9. The method of claim 4 further comprising:
   forming a layer of insulating material on the semiconductor substrate and around an opening of the TSV, the first layer of insulating material being formed prior to the growing of the epitaxial layer.

10. The method of claim 9 further comprising:
    forming a layer of insulating material along the sidewalls of the TSV and prior to the growing of the epitaxial layer.

11. The method of claim 10 further comprising:
    forming a layer of metal over the insulating material disposed on the sidewalls of the TSV prior to the growing of the epitaxial layer.

12. The method of claim 11 further comprising:
forming a plurality of isolation joints in the epitaxial layer, each isolation joint making contact with the insulating material disposed on the sidewalls of the TSV.

13. The method of claim 12 further comprising:
forming a trench in the epitaxial layer and around outside periphery of the plurality of isolation joints.

14. The method of claim 2 wherein said first conductivity type is p-type and said second conductivity type is n-type.

\* \* \* \* \*